United States Patent [19]

Tresselt

[11] 4,359,700

[45] Nov. 16, 1982

[54] BALANCING NETWORK FOR MICROWAVE POWER COMBINER

[75] Inventor: Carl P. Tresselt, Baltimore, Md.

[73] Assignee: The Bendix Corporation, Baltimore, Md.

[21] Appl. No.: 194,746

[22] Filed: Oct. 7, 1980

[51] Int. Cl.³ .............................................. H01P 5/12
[52] U.S. Cl. .................... 333/136; 330/287; 333/185
[58] Field of Search ............. 330/287; 331/56, 107 P, 331/185; 333/100, 12, 136, 137, 123, 127, 128; 307/296, 317

[56] References Cited

U.S. PATENT DOCUMENTS

| | | | |
|---|---|---|---|
| 2,865,006 | 12/1958 | Sabaroff | 333/12 X |
| 3,091,743 | 5/1963 | Wilkinson | 333/127 |
| 3,422,377 | 1/1969 | Vient | 333/127 |
| 3,529,265 | 9/1970 | Podell | 333/127 |
| 3,533,008 | 10/1970 | Lee | 330/287 X |
| 3,931,587 | 1/1976 | Harp et al. | 330/287 X |
| 4,121,174 | 10/1978 | Aston | 330/287 X |
| 4,282,492 | 8/1981 | MacMaster et al. | 333/137 X |
| 4,291,279 | 9/1981 | Buck | 330/287 |

Primary Examiner—Paul L. Gensler
Attorney, Agent, or Firm—W. G. Christoforo; Bruce L. Lamb

[57] ABSTRACT

The diode bias input terminals of an IMPATT microwave power combiner are resistively coupled to a common floating node to provide stabilization of the operating points of the individual IMPATT diodes, thus minimizing the tendency of the diodes to contribute unequally to total RF output, particularly in a varying temperature environment. The optional inclusion of RF lossy bypass capacitors to ground several points of the common node suppresses bias circuit oscillations.

9 Claims, 9 Drawing Figures

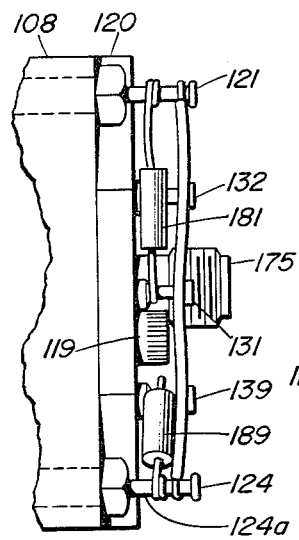
FIG. 4
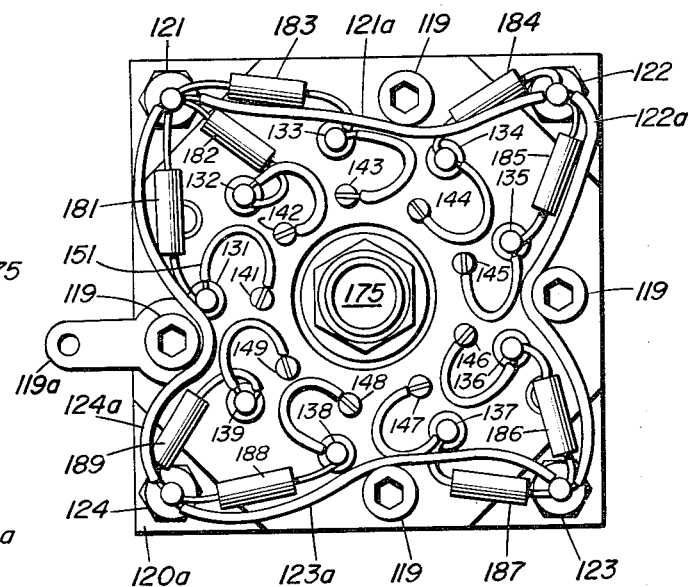
FIG. 3
FIG. 5
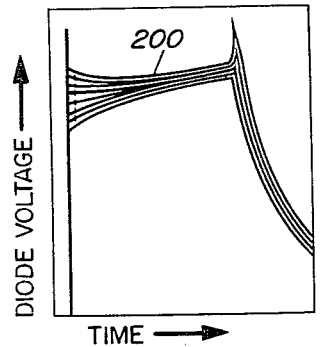
FIG. 7
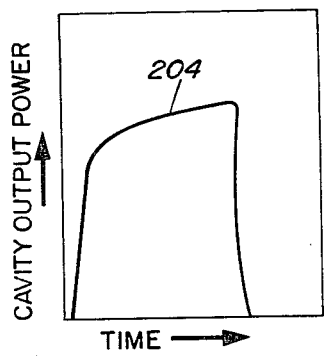
FIG. 9
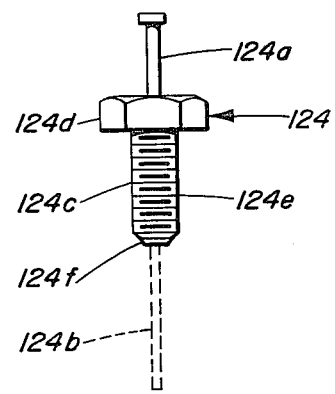
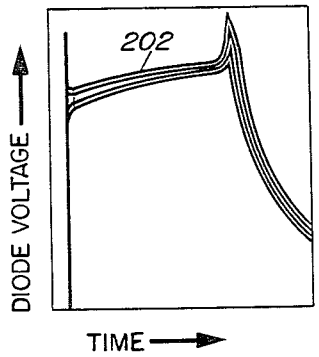
FIG. 6
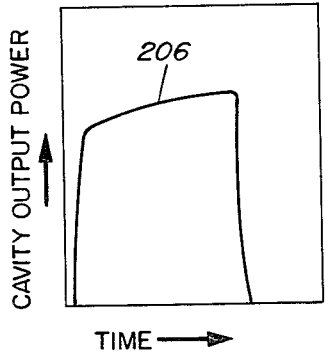
FIG. 8

BALANCING NETWORK FOR MICROWAVE POWER COMBINER

This invention relates to solid state microwave power combiners having a plurality of cooperating microwave avalanche diodes such as those diodes commonly termed IMPATT diodes and more particularly to means for stabilizing the operating points of the individual diodes.

Recent advances in solid state technology have lead to the availability of both CW and pulsed IMPATT gallium arsenide diodes which have superior DC to RF power conversion efficiency over those of the prior art and more readily available silicon solid state devices. Unfortunately, the power output level of the gallium arsenide devices tends to be more sensitive to temperature variations. In addition, under pulsed conditions, a device having gallium arsenide diodes as its active elements will often experience frequency variations during an energizing current pulse due to junction temperature increases in response to the current drive pulse, since, in common with silicon diodes, the voltage which appears across the gallium arsenide diode junction rises during the energizing current pulses due to junction thermal heating.

Improvement in lowering these frequency and power variations by the use of a preheat pulse of relatively low current prior to the energizing current pulse has been described in the copending patent application "Pulsed Solid State Device Having a Preheat Circuit to Improve Pulse Shape and Chirp", Ser. No. 124,004, filed Feb. 25, 1980, now U.S. Pat. No. 4,306,237, by the inventor of the present invention and assigned to the same assignee.

The RF power output from an individual gallium arsenide diode is, of course, relatively small. Thus, in order to achieve power levels high enough for system uses, it is normal to sum the power output of several diodes in a resonant cavity combiner of the TM010 or similar mode varieties. If the diodes used in a combiner cavity are not perfectly matched with one another, a situation not normally or easily achievable in real life situations, there is a tendency for the diodes to interact with one another, with unequal contributions to total output from each of the individual diodes. This tends to overload certain of the diodes and may require the power handling capability of the cavity to be adjusted lower than if all diodes contributed equally in order not to overload any diode. Variations in load sharing among the various diodes normally occurs during the current drive pulse due to current drive pulse junction heating of the type described above and can also occur with changes in the ambient temperature at which the diodes operate.

In gallium arsenide diode applications such as airborne weather radar, comparatively long transmitter radar pulsewidth, on the order of 18 microseconds, at relatively low duty cycle, is employed. This radar pulsewidth is several times the pulsewidth of the basic 3 to 5 microsecond thermal time constant of the gallium arsenide junction. Over the time of this relatively long pulse, the match between commercially available diodes in terms of power, frequency and voltage variations leaves much to be desired.

High efficiency can be obtained from gallium arsenide diodes by operating them in the so-called premature collection mode. If the cavity is adjusted to operate in the premature collection mode at room temperature and thus produce the maximum available power, subsequently subjecting the same cavity to relatively high temperatures will cause the diodes to revert to a lower efficiency, so-called IMPATT mode. Since part of the higher junction temperature is caused by drive pulse heating of the diode junction, the diode will operate in the collection mode at the beginning of the current drive pulse but will revert to the IMPATT mode at the end of the drive pulse. Diode power output under these conditions might drop by 6 dB over the pulse period. In order to maintain collection mode operation over a relatively long current drive pulse and thus avoid the above described power drop it is necessary to decouple the cavity at the lower junction temperature, that is, at the beginning of the current drive pulse, such that less than maximum available power is then produced. This is done by lowering the real impedance load present to each diode from that which produces maximum available power, with an associated reduction in the maximum pulsed bias potential across each diode for a given applied bias current. Although this method of cavity tuning provides the desired diode operation at elevated temperature, there is a tendency for the diodes to become unbalanced in terms of load sharing, even more than might be expected from normal commercial diode mismatching, at room temperature and below. Tuning a multiple diode cavity becomes quite difficult under these conditions.

SUMMARY OF THE INVENTION

According to the present invention a cavity using a plurality of gallium arsenide, hereinafter IMPATT, diodes as the active elements has the diode bias input terminals resistively coupled to a common node, that is, a network point which is common to a number of circuit elements, which point is not tied or connected directly to any fixed or driven voltage or current source except through the above mentioned elements so that the voltage at the node or point "floats" in accordance with signals received through such elements. Such a node is hereafter referred to as a "floating node". This provides stabilization of the operating points of the individual diodes thus minimizing the tendency of the diodes to contribute unequally to the total RF output power. This scheme provides a margin against the deleterious effects described in the previous section such that cavity tuning becomes tractable even for a relatively poorly matched set of diodes.

According to an optional modification of the above invention RF lossy capacitors are used to ground several points of the common node to suppress bias circuit oscillation.

An advantage of the invention is that it provides a relatively easily tunable multi-diode microwave cavity.

Another advantage of the invention is that diode reliability is improved due to the avoidance of serious load sharing moding and the attenuation of bias circuit oscillations.

BRIEF DESCRIPTION OF THE DRAWINGS

FIG. 3 is a plan view of a nine diode cavity version of the invention.

FIG. 4 is a partial side view of the device of FIG. 3.

FIGS. 5, 6, 7 and 8 are curves which illustrate the improvements in cavity performance by the use of the present invention.

FIG. 9 shows pi filter used as a floating node.

DESCRIPTION OF THE PREFERRED EMBODIMENT OF THE INVENTION

Although a number of resonant structures or cavities can be used for summing the power of individual IMPATT diodes, the preferred embodiment of the invention will be described as used in a TM010 mode cavity power combiner. This basic cavity has been described by R. S. Harp and H. L. Stover in the paper, THPM 10.3, "Power Combining of X-Band IMPATT Circuit Modules", given Feb. 15, 1973 at the IEEE ISSCC. Improvements to the basic structure were described by R. S. Harp and K. J. Russell in the paper, THAM 9.2, "Improvements in Bandwidth and Frequency Capability of Microwave Power Combinatorial Techniques", given on Feb. 14, 1974 at the IEEE ISSCC. These basic cavities are generally conventional and well known to those skilled in the art, thus one should consult the literature for specific details of their construction and operation, the description below of the cavities being merely to orient the present invention in its environment.

Figure 1:
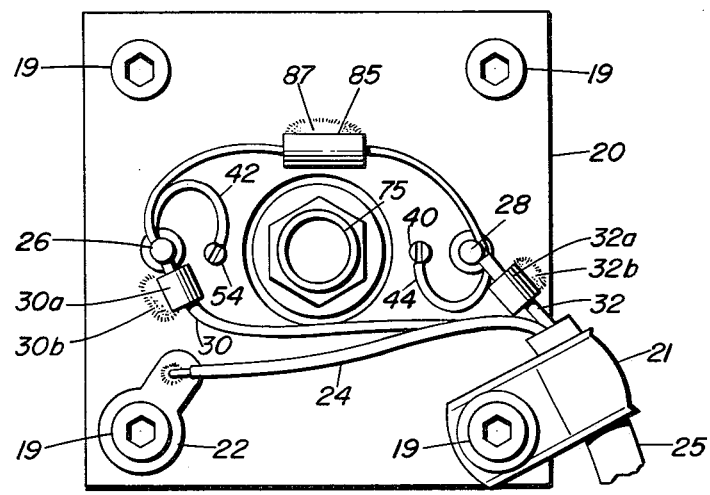
FIG. 1 is a plan view of a two diode cavity version of the invention.
Figure 2:
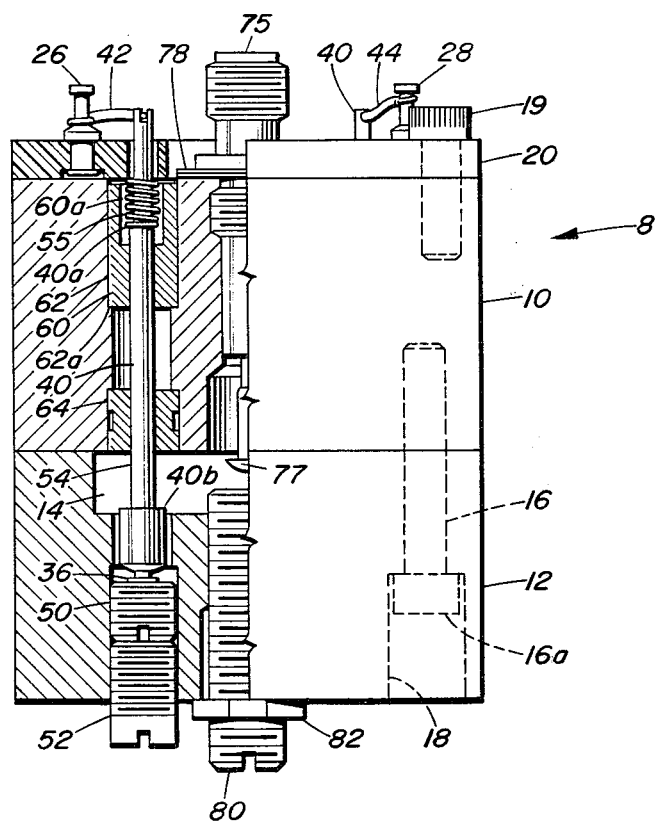
FIG. 2 is a partial cut-away side view of the device of FIG. 1.

FIGS. 1 and 2 are respectively the plan and partially cut-away side view of a two-diode microwave cavity using the present invention. The two-diode cavity is the simplest possible application and easily illustrates the invention. Referring to these figures wherein like numerals designate the same items, a two-diode cavity device is comprised of a two piece aluminum block structure 8 having a top piece 10 and a bottom piece 12. The cavity 14 proper is a circularly symmetrical void formed into bottom piece 12. For X-band, as in the present embodiment, the cavity is 0.980 inches in diameter by 0.200 inches high. The two pieces 10 and 12 are held together by cap screws located at the corners of the block and exemplified by cap screw 16 whose bead 16a is conveniently recessed in bore 18. Attached to the top of block 8 is a non-conductive plate 20, suitably of epoxy-fiberglass, fixed to block 8 through four cap screws 19. A solder lug 22 under one cap screw 19 provides a means for grounding block 8 for the current drive pulses applied to the diodes. The ground is provided by soldering lug 22 to a ground wire 24 contained as one conductor in the drive pulse cable 25. Two solder terminals 26 and 28 have been swaged in place on plate 20, to serve as connection points for wires 30 and 32, respectively, of cable 25 which bring power to the diodes from pulse current sources (not shown). For clarity, cable 25 and wires 24, 30 and 32 are not shown in FIG. 2. A standard cable clamp 21 secures cable 25 to block 8 at one of the screws 19.

Referring now more particularly to the cut-away portion of FIG. 2, the following description is of the coupling rod/transformer structures 40, only one of which is seen in full. It should be understood that a second identical coupling rod/transformer structure 40 is located on the right hand half of block 8 of FIG. 2. Flexible leads 42 and 44 provide electrical connection from terminal posts 26 and 28, respectively, to the coupling rod/transformer structures 40. IMPATT diode 36 is mounted in threaded metal plug 50 whose position in piece 12 can be varied by means of a screwdriver, and then securely grounded by tightening the hollow threaded jammer 52 behind the plug. The enlarged diameter end 40b of rod structure 40 which bears on the top of diode 36 accommodates changes in the diode reference plane as it is spring loaded by springs 55 which bear between the underside of plate 20 and a shoulder 40a of rod 40 within bore 60a of a lossy dielectric support bead 60. Support bead 60 is in turn located against shoulder 62a of bore 62 in piece 10. Support bead 64 in bore 62 centers rod 54 within a center hole therein. Rod 40 is free to move axially against spring 55 in response to adjustment of the diode plane by turning threaded plug 50 as should now be obvious.

The lossy nature of bead 62 provides suppression by moding (and some bias circuit oscillations) as originally discussed by K. Kurokawa and F. M. Magalhaes in "An X-Band 10 Watt Multiple IMPATT Oscillator", Proc. IEEE (letters) pages 101–103, January 1971. The use of blunt ends on bead 62, as is preferable, instead of the more normal tapered geometry, as well as the careful choice of the electrical length between the bead and the cavity proper, as known to those skilled in the art, causes a reduction in the loss of cavity power which is here accepted to achieve the desired stabilization of diode operation.

With respect to the use of movable tapped metal plugs 50 for individually tuning the diodes, in certain cavities described in the prior art all diodes are mounted in the same plane thus eliminating the need for such movable plugs. In that case, careful prematching of diode characteristics is required. In long pulse applications of the type found in some weather radars, such matching of diodes with gallium arsenide diodes is a formidable task. By providing individually tunable diodes, as is here achieved by the movable tapped metal plugs 50, a fairly broad spectrum of individual diodes can be accommodated in the same cavity.

RF coupling to the cavity is through a coaxial connector 75 mounted centrally in block 8 and having a center conductor or probe 77 which extends into cavity 14. The degree of cavity coupling can be grossly adjusted by changing the thickness of the spacing washer stack 78 located under the head of connector 75. Fine coupling adjustment is made through the use of plunger or tuning rod 80 screwed into bottom piece 12 and locked in place by jam nut 82. If the spacing between probe 77 and rod 80 is decreased, cavity coupling is increased, the real impedance presented to the diodes increases and the cavity output RF level increases.

In this simple two-diode cavity application the invention consists of the addition of a single resistor 85 (shown only in FIG. 1) connected between terminals 26 and 28 which provides a path for bias cross-coupling between the diodes fed from otherwise independent pulsed current sources over leads 30 and 32 of cable 25. Resistor 85 is preferably held in place on plate 20 with RTV adhesive 87.

As has been mentioned above, a certain amount of decoupling from the maximum power case at room temperature is required to provide for operation at high temperatures within the high-efficiency, premature collection mode. In this mode of diode operation a significant RF level/applied diode bias interaction occurs. Assuming resistor 85 is not used, a lightly loaded two-diode cavity will exhibit essentially bistable behavior of the diodes: one diode predominates over the other in oscillating with a higher DC potential. This effect will be present even with perfectly matched gallium arsenide diodes. Differences in DC voltage as large as 10 volts are common (45 volts on one diode versus 55 volts on the other). By adjusting the diode mounting plane (by manipulation of plug 50) (FIG. 2), one can choose which diode dominates.

Although the decoupling required for high temperature operation is normally less than that which produces true bistable behavior, a tendency toward such behavior does remain, making tune-up of even a two-diode cavity difficult. Addition of bias cross-coupling resistor 85 minimizes that effect. The diode with the higher operating voltage will pump extra operating current through resistor 85 into the diode with the lower operating voltage. That extra current flowing into the diode increases the RF power level produced by the diode and the DC potential across it. The extra RF power produced by that diode interacts in the cavity with the power produced by the dominant diode tending to suppress or diminish the RF power produced by the dominant diode. The net effect is for the diode DC voltages to become more alike, with a more equal RF contribution from each diode.

A value of 100 ohms for resistor 85 has been found useful in a two-diode cavity which produces a nominal 18 watts in minimizing tuning difficulties due to decoupling. Although the same cavity might produce 25 watts if recoupled to produce the maximum power output from the same diodes at the same drive current level, it would be incapable or have difficulty in operating above room temperature.

The two-diode cavity might be considered a degenerate form of the invention in that a single resistor is used to couple the diode bias input terminals. However, if one considers the single resistor to be two separate resistors each of one-half the value of the single resistor, the two separate resistors being connected together at their midpoint, the generic definition of the invention as the resistive coupling of the diode bias input terminals to a common floating node is met. A more general illustration of the invention which more clearly meets this definition is seen at FIGS. 3 and 4, reference to which should now be made. Although the interior construction of block 8 is not shown it should be understood that such construction is similar to that shown in FIG. 2, except, of course, the present cavity includes 9 diodes, and made according to the teachings of the prior art. The present invention, as should be clear, resides in the details fully shown, particularly at FIG. 3. There is shown block 108 which comprises the 9-diode cavity and having a non-conductive top plate 120 similar to plate 20 of FIGS. 1 and 2 except that the corners thereof, for example corner 120a, are cut-away as shown. A coaxial connector 175, similar to connector 75 of FIGS. 1 and 2, provides electrical RF communication with the cavity. Plate 120 is held to block 108 by four capscrews 119, one of which includes a ground solder lug 119a. For clarity, a cable which includes a ground lead to be soldered to lug 119a, as well as nine separate bias drive leads, one for each diode, is not shown. It should be understood that a cable similar to cable 25 of FIG. 1 is used, except, of course, for 9 bias drive leads rather than the two bias drive leads of FIG. 1. The top of nine rod structures 141-149 are seen in FIG. 3, each rod structure being similar or identical to rod structure 54 of FIG. 2. Associated with each rod structure is an insulated or stand off terminal, thus there are a total of nine associated terminals 131-139. The nine bias drive leads of the cable not shown are respectively connected to terminals 131-139. These terminals are in turn respectively connected to their associated rod structure; for example, terminal 131 connected to rod structure 141 by lead 151. Four insulated or standoff terminals, 121-124, mounted in block 108 respectively at the cut-away corners 120a of plate 120, together with interconnecting leads 121a, 122a, 123a and 124a, comprise the above mentioned floating node. Nine resistors, 181-189, each associated respectively with terminals 131-139, resistively couple the terminals to the floating node. For example, resistors 181, 182 and 183 respectively connect terminals 131, 132 and 133 to the floating node at terminal 121. Resistors 184 and 185 connect terminals 134 and 135 respectively to the floating node at terminal 122. Resistors 186 and 187 respectively connect terminals 136 and 137 to the floating node at terminal 123. Resistors 188 and 189 respectively connect terminals 138 and 139 to the floating node at terminal 124.

It will be noted that the nine resistors 181-189 are connected to the rod structures 141-149 by relatively short leads; for example, lead 151. In a further improvement terminals 121-124 are standoff capacitors so that the common node, and hence, the common end of all resistors, become essentially grounded at high frequencies, thereby resistively loading each diode bias point by the value of its resistor 181-189. This technique eliminates or greatly attenuates the problems caused by the IMPATT devices characteristic susceptibility to bias circuit oscillations, due to negative impedance effects. More particularly, the self inductance of relatively long bias leads can provide a tank circuit which causes oscillations in the VHF and UHF regions. These oscillations are effectively suppressed by the standoff capacitors so that bias lead length is not as critical as before. It has been discovered that standoffs made from lossy dielectric filters of the type known as "pi filters" are superior for this usage. In a unit actually built according to FIGS. 3 and 4 pi filters made by Erie Technological Products, Inc. of Erie, Pa., part number 1250-003, were used as the terminals 121-124. A typical pi filter is shown at FIG. 9, reference to which should now be made. The typical pi filter 124 is comprised of a feed through rod having ends 124a and 124b held centrally within a hollow cylindrical shell 124c by an RF lossy material, not shown. Shell 124c includes a hex portion 124d and a threaded end 124e which is threaded into a hole in block 108 as shown in FIG. 4. End 124b is here shown in broken line as it is removed for the present application and the remaining stub sealed with epoxy cement 124f. In the case of the two-diode cavity of FIGS. 1 and 2, resistor 85 can be split into two equal resistors, each of one-half the value of resistor 85, and connected together at a stand-off capacitor, to be added, similar to the stand-off terminals 121-124 of FIGS. 3 and 4, which, in the improved embodiment comprise stand-off capacitors. As an alternative ferrite beads can be provided on bias leads 30 and 32 to suppress oscillations. Such ferrite beads 30a and 32a are seen in FIG. 1. The beads are suitably held with RTV adhesive 30b and 32b against plate 20.

In the nine-diode cavity design of FIGS. 3 and 4, resistors 181-189 were each 27 ohms. This provided somewhat tighter feedback control than the effective 50 ohms used with the two-diode cavity design of FIGS. 1 and 2. FIGS. 5 and 6, reference to which should now be made, shows a comparison in diode performance achieved before and after resistors 181-189 were installed. A 9-diode cavity was actually tuned with the resistors installed to obtain the curves of FIG. 6 and then the resistors were removed to illustrate the contrasting data of FIG. 5. All the diode reference planes were adjusted to produce essentially the same 56 volt level at the end of an 18 microsecond pulsewidth. Referring to FIG. 5, a family of curves 200, one curve for each diode 181-189, is shown having diode voltage on the vertical coordinate and pulse time on the horizontal. At the front of the pulse there is an initial spread of about 12 volts, indicating unequal contributions to the RF pulse from the various diodes. Trace 202 of FIG. 6 shows the same family of curves with the resistance network comprised of resistors 181-189 installed. It can be seen there is less voltage divergence in the family of curves 202, there being about 4 volts maximum divergence, or about one-third the divergence without the resistance network. This, of course, indicates that the diodes are sharing the load more equitably.

The spike at the trailing end of the curves of FIGS. 5 and 6 is the characteristic voltage spike which occurs when a circuit through a capacitor is interrupted as occurs here when the diode drive is terminated. The spike at the leading edge of the curves of FIGS. 5 and 6 is explained by considering that the IMPATT diodes are negative resistance devices over at least part of their operational range. The spike evidences the voltage required to bias them into the negative resistance region.

FIGS. 7 and 8, reference to which should now be made, illustrate the cavity RF output signal without and with the resistance network respectively of resistors 181-189. As can be seen, without the resistance network the RF output pulse 204 of FIG. 7 sags at the leading edge. The RF output pulse 206 of FIG. 8 is relatively flatter over its entire period.

Having described these embodiments of my invention, various alterations and modifications thereof should now be obvious to one skilled in the art. Accordingly, the invention is to be limited only by the true spirit and scope of the appended claims.

The invention claimed is:

1. A microwave power combiner for combining the power output from a plurality of active electronic elements which individually generate RF power in response to individually impressed bias applied at bias points, a typical said bias point being associated with a typical said active electronic element and communicating electrically with one electrode of its associated active electronic element, the other electrode of said associated active electronic element being connected in common with the other electrode of the other active electronic elements to a bias return terminal, an improvement comprising:

a floating node;

a plurality of essentially identical resistors, a typical said resistor being associated with a typical said active electronic element connecting the bias point of said associated active electronic element to said floating node; and, means capacitively coupling said floating node to said bias return terminal.

2. The improvement of claim 1 wherein said means capacitively coupling comprises a pi filter.

3. The improvement of claims 1 or 2 including a plurality of bias leads, one for each of said active electronic elements for individually impressing bias at said bias points and including means for suppressing electrical oscillations on said bias leads.

4. The improvement of claim 3 wherein said means for suppressing electrical oscillations includes a plurality of ferrite beads mounted on said bias leads.

5. The improvement of claim 1 wherein said active electronic elements comprise gallium arsenide diodes.

6. The improvement of claim 1 wherein said plurality of active electronic elements consists of 9-gallium arsenide diodes and said resistors are about 27 ohms each.

7. The improvement of claim 6 wherein said floating node is capacitively connected to the bias return terminal through a pi filter.

8. The improvement of claim 1 wherein said plurality of active electronic elements consists of 2-gallium arsenide diodes and said resistors are about 50 ohms each.

9. The improvement of claim 8 including 2-bias leads and ferrite beads mounted on said bias leads.

* * * * *